United States Patent
Tu et al.

(10) Patent No.: US 8,031,020 B1
(45) Date of Patent: Oct. 4, 2011

(54) BIAS CIRCUIT TO REDUCE FLICKER NOISE IN TUNABLE LC OSCILLATORS

(75) Inventors: Cao-Thong Tu, Preverenges (CH); David Cousinard, Morges (CH); Michel Moser, Cheyres (CH)

(73) Assignee: Marvell International Ltd., Hamilton (BM)

( * ) Notice: Subject to any disclaimer, the term of this patent is extended or adjusted under 35 U.S.C. 154(b) by 29 days.

(21) Appl. No.: 12/433,574

(22) Filed: Apr. 30, 2009

Related U.S. Application Data

(60) Provisional application No. 61/057,090, filed on May 29, 2008.

(51) Int. Cl.
- *H03B 5/12* (2006.01)
- *H03K 3/354* (2006.01)
- *H03L 1/00* (2006.01)

(52) U.S. Cl. .................................. 331/117 FE; 331/185

(58) Field of Classification Search ............ 331/117 FE, 331/117 R, 167, 185
See application file for complete search history.

(56) References Cited

U.S. PATENT DOCUMENTS

| | | | | |
|---|---|---|---|---|
| 6,091,307 A | * | 7/2000 | Nelson ........................... | 331/109 |
| 6,680,655 B2 | * | 1/2004 | Rogers ........................... | 331/109 |
| 6,867,658 B1 | * | 3/2005 | Sibrai et al. .................... | 331/185 |
| 7,116,183 B2 | * | 10/2006 | Wu ................................. | 331/176 |
| 7,199,698 B1 | * | 4/2007 | Goldfarb .................... | 331/177 V |
| 7,336,138 B2 | * | 2/2008 | Kitamura et al. ............. | 331/186 |

* cited by examiner

*Primary Examiner* — Levi Gannon

(57) ABSTRACT

In one embodiment, the present invention includes noise reduction circuits and methods. In one embodiment, cross coupled switching transistors incorporate bias voltages between the control terminal of each transistor and the drain of the other transistor. The bias voltages increase the voltage on each transistors drain terminal and reduce noise upconversion in the system. In one embodiment, the source voltages of each transistor may be increased to linearize the circuit and further reduce noise. In another embodiment, a current is coupled to a PN junction to generate a low noise bias voltage. The bias voltage is used to bias capacitors of a selectively activated and deactivated capacitance to reduce noise. Features and advantages of the present invention may be implemented in an oscillator circuit, which may be used in a communication system, for example.

21 Claims, 10 Drawing Sheets

BIAS CIRCUIT TO REDUCE FLICKER NOISE IN TUNABLE LC OSCILLATORS

CROSS REFERENCE TO RELATED APPLICATIONS

This application claims the benefit of priority from U.S. Provisional Application No. 61/057,090, filed May 29, 2008, entitled "Bias Circuit to Reduce Flicker Noise in Tunable LC Oscillators" the entire disclosure of which is hereby incorporated herein by reference.

BACKGROUND

The present invention relates to noise reduction, and in particular, to circuits and methods to reduce noise in oscillator circuits.

Noise is a common problem in circuit design. Noise in integrated circuits may be caused by a variety of phenomena and may adversely affect the performance of the circuit or system in which the circuit operates. FIG. 1 is an example of a typical oscillator circuit that is affected by noise. Oscillator circuit 100 includes an inductive load "L" and capacitive load "C" that are driving by a pair of switching transistors 101 and 102. In this example, the switching transistors 101 and 102 are configured as a cross-coupled pair, where a gate of transistor 101 is coupled to the drain of transistor 102, the gate of transistor 102 is coupled to the drain of transistor 101, and the sources are coupled together and to ground. Ideally, oscillator circuit would resonate at the following frequency:

$$\omega = 1/sqrt(LC).$$

However, noise in the circuit will cause the oscillation frequency to vary from the ideal resonant frequency. Such variations from the ideal resonant frequency may cause deleterious effects on the performance of other system functions.

To understand how noise affects a circuit, such as an oscillator circuit, it is helpful to understand how individual devices in the circuit introduce noise into the system. FIG. 1 further illustrates the noise generated by MOS devices, such as the transistors 101 and 102. Plot 150 shows two noise components. The first noise component is referred to as flicker noise (or 1/f noise). As illustrated in plot 150 at 111, flicker noise decreases with increasing frequency. For example, flicker noise may decrease at a rate of −10 db/decade. The second component of noise is thermal noise, which is illustrated at 112. Thermal noise is regarded as the same across frequencies. As illustrated in plot 150, at some frequency $f_k$ the flicker noise 111 may fall below the thermal noise 112.

When devices are combined into a circuit, the noise components are converted into system errors or system noise. For example, plot 160 in FIG. 1 illustrates how the device noise components of from plot 150 are converted into phase noise in oscillator 100. As illustrated in plot 160, flicker noise is converted into a −30 dB/decade phase noise component 113 and the thermal noise is converted into a −20 dB/decade phase noise component 114. The intersection of these two noise components occurs at a frequency of $\Delta f_{k1}$, which is sometimes referred to as the noise corner frequency. This phase noise profile expresses the frequency component shifts in the oscillator output signal around the resonant (or center) frequency of the oscillator.

From plot 160, it can be seen that low frequency noise components can cause a significant impact on a circuits performance, including degradation of the frequency stability of an oscillator, for example. Thus, it is desirable to reduce noise in oscillators and other circuits. The present invention solves these and other problems by providing noise reduction circuits and methods.

SUMMARY

Embodiments of the present invention improve circuits and methods of noise reduction circuits. In one embodiment, the present invention includes a circuit (e.g., an integrated circuit) comprising a first transistor having a control terminal, a drain terminal, and a source terminal, a second transistor having a control terminal, a drain terminal, and a source terminal, a first bias network having a first terminal coupled to the control terminal of the first transistor and a second terminal coupled to the drain terminal of the second transistor, the first bias network generating a first voltage difference between the control terminal of the first transistor and the drain terminal of the second transistor, and a second bias network having a first terminal coupled to the control terminal of the second transistor and a second terminal coupled to the drain terminal of the first transistor, the second bias network generating a second voltage difference between the control terminal of the second transistor and the drain terminal of the first transistor. A load circuit has a first terminal coupled to the drain of the first transistor and a second terminal coupled to the drain of the second transistor.

In one embodiment, the first bias network comprises a first resistor coupled between the control terminal of the first transistor and the drain terminal of the second transistor, and the second bias network comprises a second resistor coupled between the control terminal of the second transistor and the drain terminal of the first transistor.

In one embodiment, the first bias network further comprises a first capacitor coupled between the control terminal of the first transistor and the drain terminal of the second transistor, and the second bias network comprises a second capacitor coupled between the control terminal of the second transistor and the drain terminal of the first transistor.

In one embodiment, the first bias network further comprises a first current source coupled to the control terminal of the first transistor, and the second bias network comprises a second current source coupled to the control terminal of the second transistor.

In one embodiment, the first bias network further comprises a third resistor coupled between the control terminal of the first transistor and a reference voltage, and the second bias network comprises a fourth resistor coupled between the control terminal of the second transistor and the reference voltage.

In one embodiment, the circuit further comprises a third bias network coupled to the source of the first transistor and the source of the second transistor, the third bias network generating a third voltage difference between the sources of the first and second transistors and a reference voltage (e.g., a supply voltage).

In one embodiment, the third bias network comprises a resistor having a first terminal coupled to the sources of the first and second transistors and a second terminal coupled to the reference voltage.

In one embodiment, the load circuit comprises inductance and capacitance, and the circuit is an oscillator circuit.

In different embodiments, the first and second transistors may be NMOS or PMOS transistors.

In one embodiment, the present invention includes a circuit comprising a driver circuit, the driver circuit generating a differential periodic signal on first and second nodes, an inductance network coupled between the first and second nodes, and a capacitance network coupled between the first and second nodes. The capacitance network comprises a first capacitor having a first terminal coupled to the first node and a second terminal and a second capacitor having a first terminal coupled to the second node and a second terminal. The circuit further includes a bias voltage generator comprising a current source coupled to a PN junction to generate a reference voltage, wherein the reference voltage is selectively coupled to the second terminal of the first capacitor and the second terminal of the second capacitor.

In one embodiment, the circuit further comprises a voltage adjust circuit coupled between the reference voltage and the second terminal of the first capacitor and the second terminal of the second capacitor, wherein the voltage adjust circuit changes the voltage selectively coupled to the second terminal of the first capacitor and the second terminal of the second capacitor.

In one embodiment, the voltage adjust circuit comprises a resistor divider.

In one embodiment, the voltage adjust circuit comprises a switched capacitor circuit.

In one embodiment, the switched capacitor circuit increases the reference voltage.

In one embodiment, the circuit further comprises a comparator having a first input coupled to an output of the voltage adjust circuit and a second input coupled to a second reference voltage and a calibration circuit having a first input coupled to an output of the comparator and an output coupled to the voltage adjust circuit, the calibration circuit sets a gain or attenuation of the voltage adjust circuit.

In one embodiment, the PN junction comprises a bipolar transistor having an emitter coupled to a supply voltage, and a base coupled to a collector.

In one embodiment, the present invention includes a 10 circuit comprising a first transistor having a control terminal, a drain terminal, and a source terminal, a second transistor having a control terminal, a drain terminal, and a source terminal, a first bias network having a first terminal coupled to the control terminal of the first transistor and a second terminal coupled to drain terminal of the second transistor, the first bias network generating a first voltage difference between the control terminal of the first transistor and the drain terminal of the second transistor, a second bias network having a first terminal coupled to the control terminal of the second transistor and a second terminal coupled to drain terminal of the first transistor, the second bias network generating a second voltage difference between the control terminal of the second transistor and the drain terminal of the first transistor, an inductance network coupled between the drain of the first transistor and the drain of the second transistor, and a capacitance network coupled between the drain of the first transistor and the drain of the second transistor. The capacitance network comprises a first capacitor having a first terminal coupled to the drain of the first transistor and a second terminal and a second capacitor having a first terminal coupled to the drain of the second transistor and a second terminal. The circuit further includes a bias voltage generator comprising a current source coupled to a PN junction to generate a reference voltage, wherein the reference voltage is selectively coupled to the second terminal of the first capacitor and the second terminal of the second capacitor.

In one embodiment, the first bias network comprises a first resistor coupled between the control terminal of the first transistor and the drain terminal of the second transistor and a first current source coupled to the control terminal of the first transistor, and wherein the second bias network comprises a second resistor coupled between the control terminal of the second transistor and the drain terminal of the first transistor and a second current source coupled to the control terminal of the second transistor.

In one embodiment, the first bias network comprises a first resistor coupled between the control terminal of the first transistor and the drain terminal of the second transistor and a third resistor between the control terminal of the first transistor and a second reference voltage (e.g., a supply), and wherein the second bias network comprises a second resistor coupled between the control terminal of the second transistor and the drain terminal of the first transistor and a fourth resistor coupled between the control terminal of the second transistor and the second reference voltage.

In one embodiment, the circuit further comprises a resistor having a first terminal coupled to, the sources of the first and second transistors and a second terminal coupled to a second reference voltage (e.g., a supply).

The following detailed description and accompanying drawings provide a better understanding of the nature and advantages of the present invention.

DETAILED DESCRIPTION

Described herein are circuits and methods for reducing noise. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
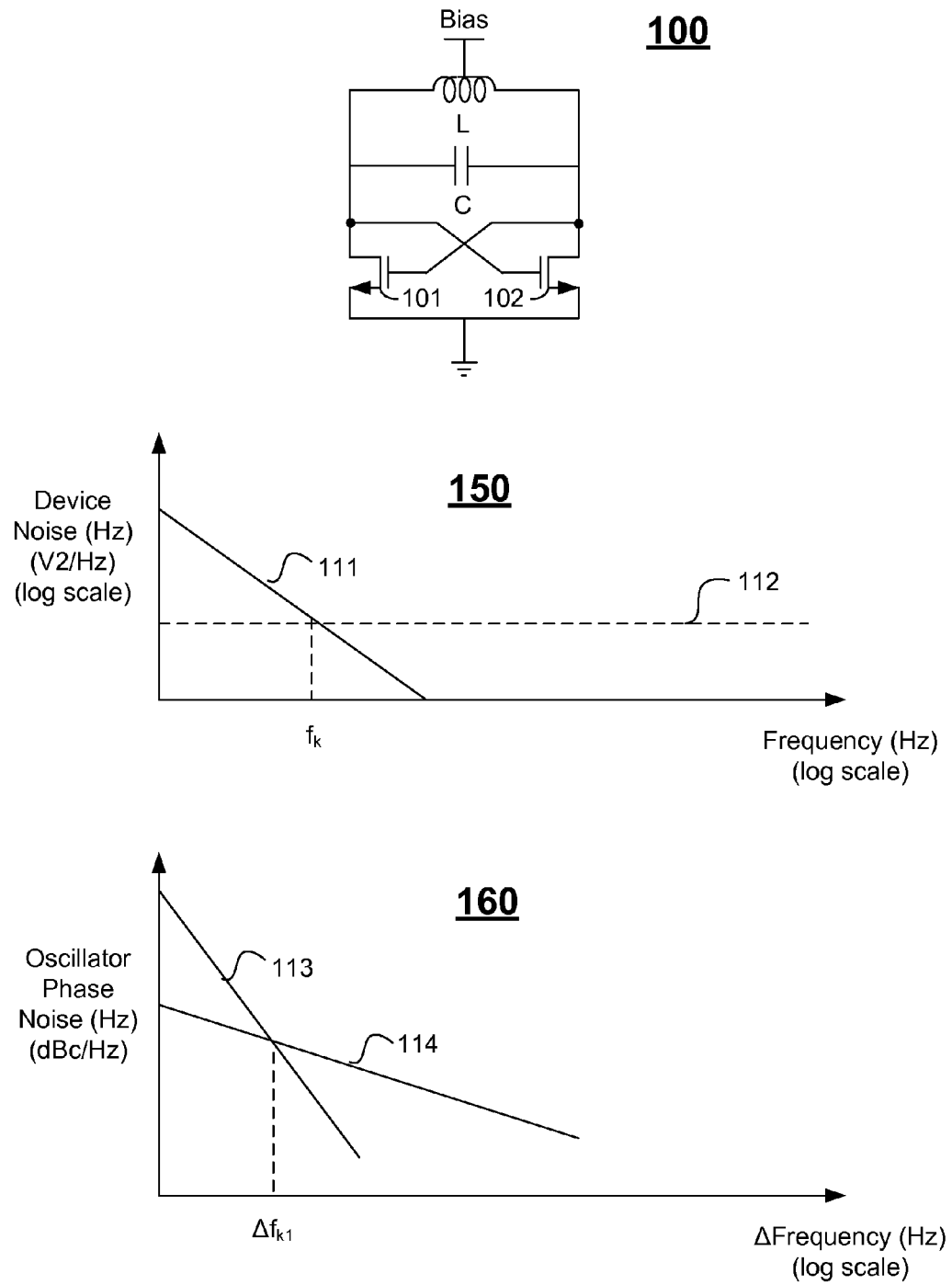
FIG. 1 is an example of a typical oscillator circuit and related noise components.
Figure 2:
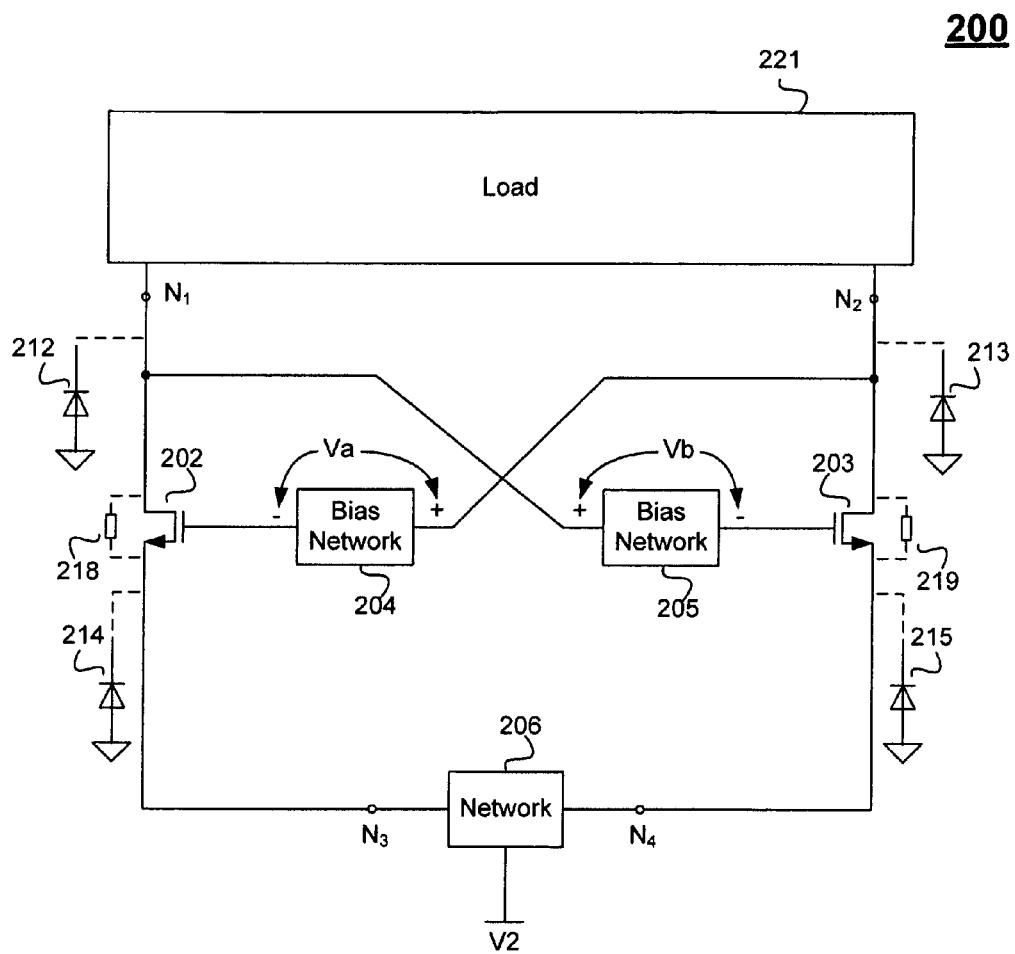
FIG. 2 illustrates a circuit according to one embodiment of the present invention.

FIG. 2 illustrates a circuit 200 according to one embodiment of the present invention. Circuit 200 may include two switching transistors 202 and 203 configured to drive a load 221. Circuit 200 further illustrates parasitic components to show how noise from the transistors is converted into circuit noise. For instance, the drain of switching transistor 202 may include a PN junction, which may be modeled as parasitic diode 212. Parasitic diode 212 includes a junction capacitance that is a function of voltage. As the voltage on the drain increases, the parasitic capacitance decreases. Similarly, the source of switching transistor 202 may include PN junction, which may be modeled as parasitic diode 214 and has the same voltage-to-capacitance relationship. Additionally, transistor 202 may include output impedance 218 that may respond to device noise. Likewise, the drain of switching transistor 203 may include a PN junction modeled as parasitic diode 213, and the source of switching transistor 203 may include PN junction modeled as parasitic diode 215. Additionally, transistor 203 may include output impedance 219. Low frequency noise, such as flicker noise, may cause variations in the gate-to-source voltage Vgs of each transistor, which in turn causes variations in the drain voltage, and thereby causes variations in capacitance. The variations in capacitance at the drain may impact the load. For example, if the load is an LC load, the variation in capacitance at the drain of each transistor may change the resonant frequency of the output signal.

Features and advantages of the present invention include configuring a bias voltage between the gate terminal of transistor 202 and the drain terminal of transistor 203 to increase the bias voltage on the drain terminal of transistor 203. Similarly, a bias voltage is configured between the gate terminal of transistor 203 and the drain terminal of transistor 202 to increase the bias voltage on the drain terminal of transistor 202. For instance, circuit 200 includes a bias network 204 for generating a bias voltage Va between the gate of transistor 202 and the drain of transistor 203. Likewise, bias network 205 for generating a bias voltage Vb is configured between the gate of transistor 203 and the drain of transistor 202. The resulting increased voltage on the drain terminals of transistors 202 and 203 reduces the sensitivity of the drain terminals to capacitance variations caused by low frequency noise, including flicker noise voltages across the gate to source of each device. In one embodiment, the circuit may further include a network 206 for increasing the bias voltage at the source terminals of transistors 202 and 203. Increasing the voltage at the source of each transistor similarly reduces the circuit's sensitivity at the source terminals to capacitance variations. For example, network 206 may generate voltages at nodes $N_3$ and $N_4$ that are higher than a low power supply voltage V2 (e.g., ground).

Figure 3A:
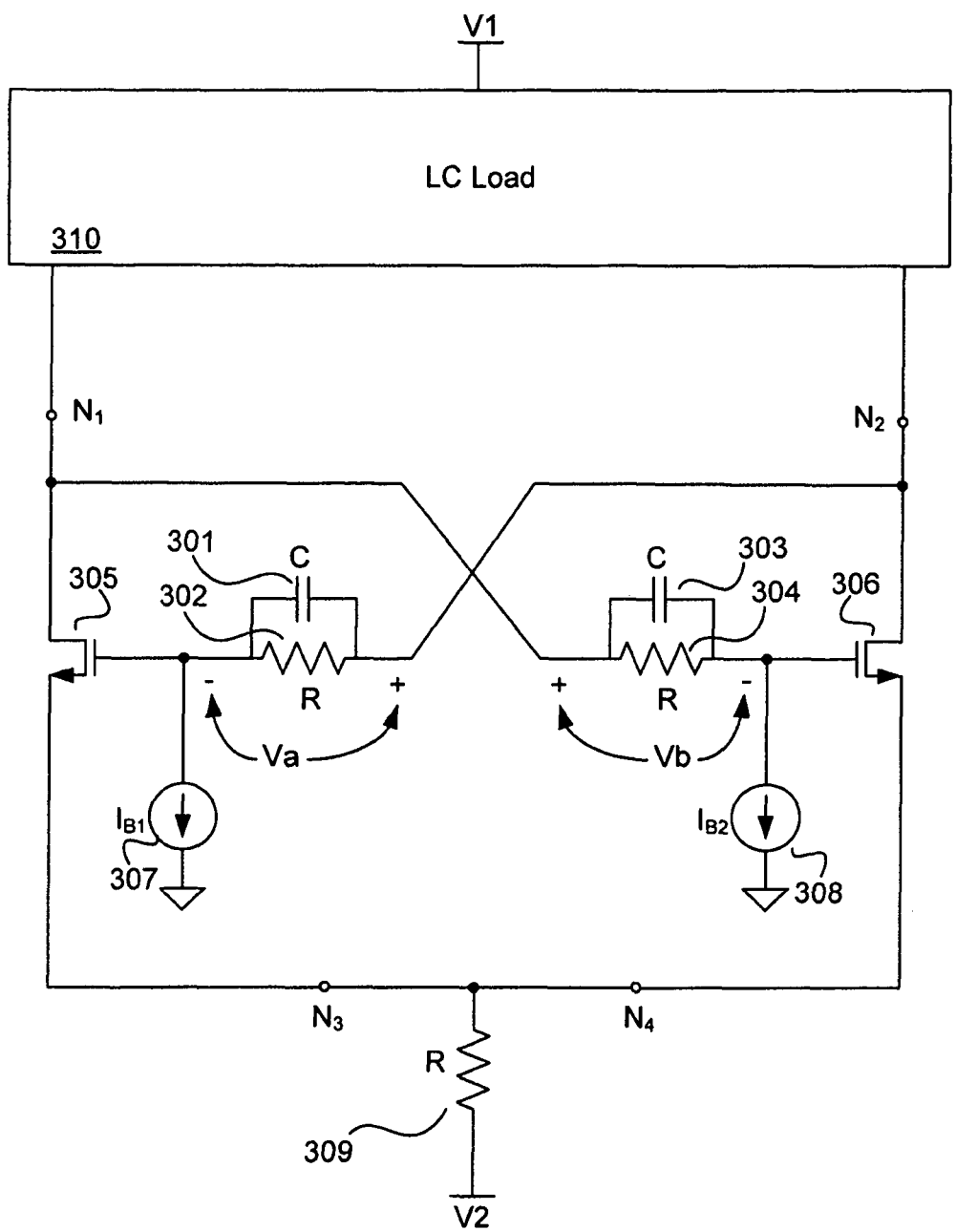
FIG. 3A illustrates an example oscillator circuit according to one embodiment of the present invention.

FIG. 3A illustrates an example oscillator circuit according to one embodiment of the present invention. Oscillator circuit 300A includes switching transistors 305 and 306 for driving an LC load 310 including inductance and capacitance for setting a resonant frequency of the oscillator. In this example, a first bias voltage, Va, between the gate of transistor 305 and the drain of transistor 306 is generated by resistor 302 and current source 307. Additionally, capacitor 301 is configured in parallel with resistor 302. Similarly, a second bias voltage, Vb, between the gate of transistor 306 and the drain of transistor 305 is generated by resistor 304 and current source 308. Additionally, capacitor 303 is configured in parallel with resistor 304. The drain terminal of transistor 305 is coupled to a node $N_1$, which is further coupled to a terminal of LC load 310. Likewise, the drain terminal of transistor 306 is coupled to a node $N_2$, which is further coupled to another terminal of LC load 310.

In one example embodiment, the source terminals of transistors 305 and 306 are biased using resistor 309. Resistor 309 has the added benefit of linearizing the circuit, decreasing common mode gain, and increasing common-mode voltage level to further reduce noise and distortion from non-linearities such as clipping of the output signal, for example. Those skilled in the art will realize that the voltage on the drain terminals of transistors 305 and 306 may be set by setting the value of current in current sources 307 and 308. For example, in one embodiment, the following example values may be used: IB1=5 uA; IB2=5 uA; R302/304=20 kohms; C301/303=500 fF, R309=150 Ohms and the voltage on the drain Vd=1V may be used for an oscillator using transistors 305 and 306 having W/L=100 um/0.1 um and a switching frequency of 1.5 GHz.

Figure 3B:
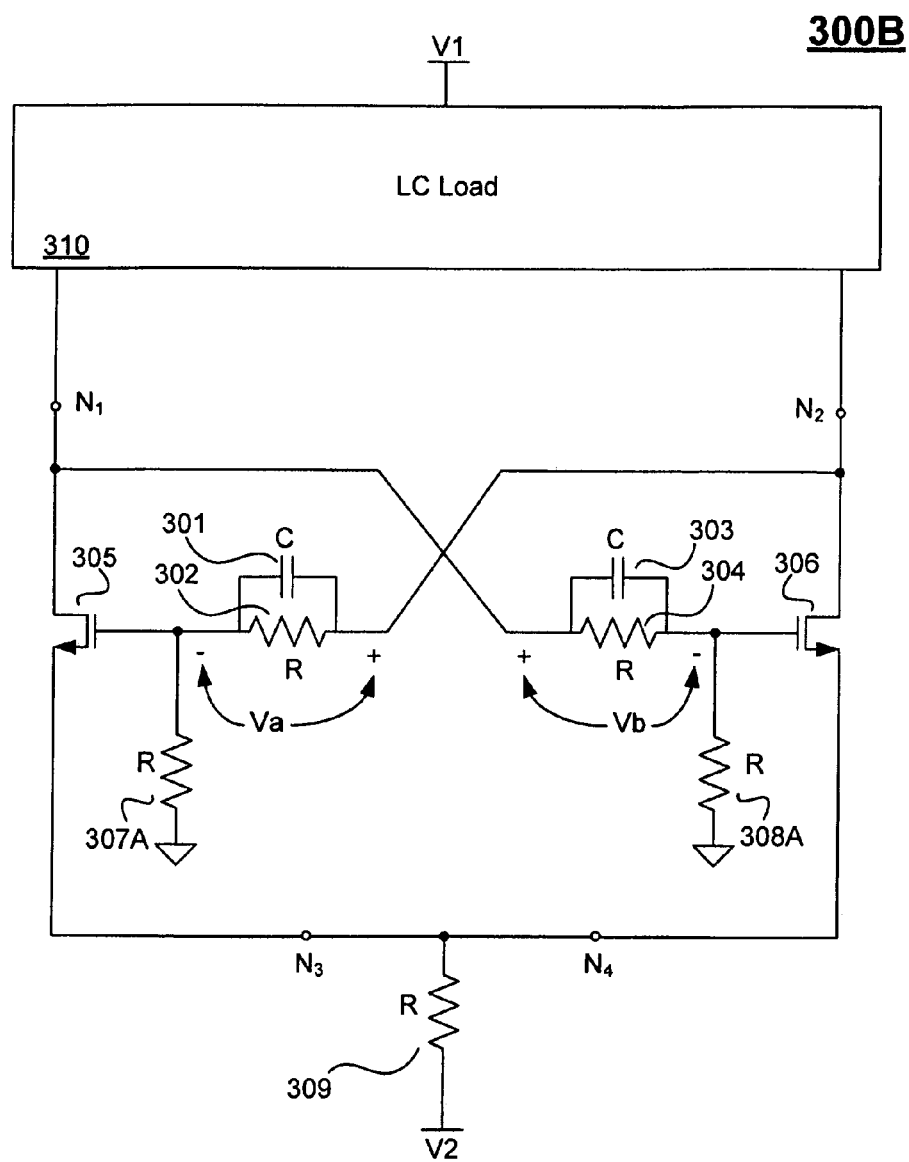
FIG. 3B illustrates an example oscillator circuit according to one embodiment of the present invention.

FIG. 3B illustrates an example oscillator circuit according to one embodiment of the present invention. In this example, current sources 307 and 308 have been replaced with resistors 307A and 308A. The values of resistors 307A and 308A may be selected to generate a desired voltage on the drain of transistor 306, and the values of resistors 308A and 304 may be selected to generate a desired voltage on the drain of transistor 305.

Figure 4:
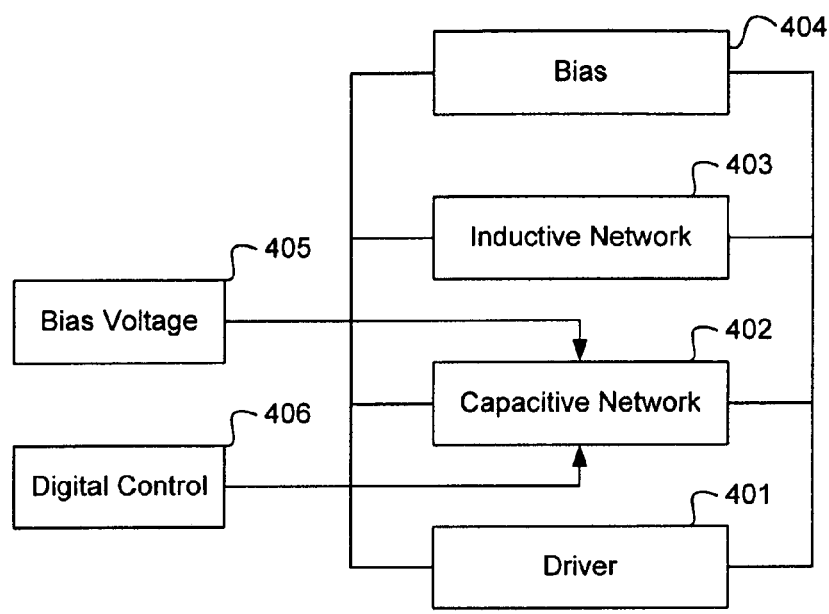
FIG. 4 illustrates a block diagram of an oscillator with adjustable capacitance according to one embodiment of the present invention.

FIG. 4 illustrates a block diagram of an oscillator 400 with adjustable capacitance according to one embodiment of the present invention. Oscillator 400 may include a driver block 401, which may include cross coupled biased transistors as described in FIG. 2, 3A, or 3B, for example. Oscillator 400 further includes a capacitive network 402, an inductive network 403, and a bias 404 coupled between the output terminals of the driver 401. In one embodiment, the resonant frequency of the oscillator may be adjusted by changing the capacitance of the capacitive network 402. For instance, the capacitance may be changed digitally under the control of digital control block 406. Capacitive network 402 may further include a bias voltage generator 405 to generate a bias voltage for biasing internal nodes. Bias voltage generator 405 may provide internal nodes of the capacitive network with a low noise voltage as described in more detail below.

Figure 5:
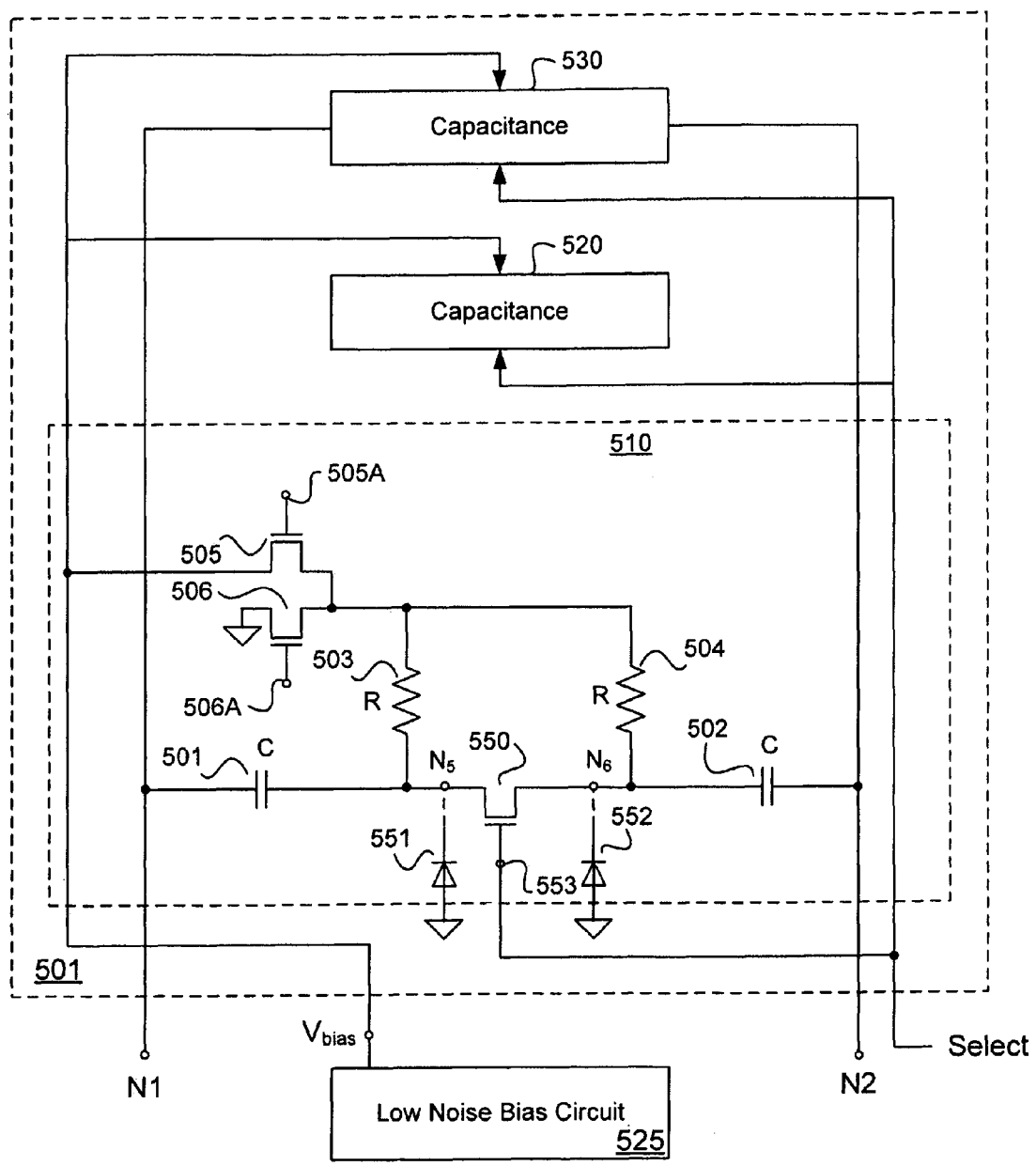
FIG. 5 illustrates an example capacitive network according to one embodiment of the present invention.

FIG. 5 illustrates an example capacitive network according to one embodiment of the present invention. In this example, a capacitive network 500 may include a plurality of capacitance blocks 510, 520, and 530 each coupled between nodes N1 and N2, where nodes N1 and N2 are output terminals of a driver circuit. Each capacitance block may receive a bias voltage and a selection signal for activating or deactivating the capacitance block. If a capacitance block is active, a capacitance is included in the load capacitance of the oscillator, and if a capacitance block is inactive, the capacitance of the block is not included in the load capacitance of the oscillator. Capacitance block 510 illustrates an example implementation of a capacitance block. Capacitance block 510 includes first and second capacitors 501 and 502 and a selection transistor 550. A first terminal of capacitor 501 is coupled to node N1 and the other terminal of capacitor 501 is coupled to a terminal of selection transistor 550. Similarly, a first terminal of capacitor 502 is coupled to node N2 and the other terminal of capacitor 502 is coupled to another terminal of selection transistor 550. When transistor 550 is activated (i.e., turned on) by the select signal, the terminals of capacitors 501 and 502 may be coupled together, which adds capacitance to the load circuit. The select signal may be coupled to the gate 553 of transistor 550, for example, and generated by digital control block 406 of FIG. 4. To remove the capacitors from the circuit, the select signal deactivates transistor 550. However, transistor 550 may have parasitic PN junctions, as illustrated by diodes 551 and 552. Accordingly, it is desirable to increase the voltage on the internal capacitor terminals (i.e., the terminals opposite the terminals connected to the driver nodes N1 and N2) so that the parasitic diodes do not become forward biased. Accordingly, the internal capacitor terminals are coupled through resistors 503 and 504 to a bias voltage Vbias by turning on transistor 505. For example, gate terminal 505A may be coupled to the select signal through an inverter (not shown) so that when transistor 550 is turned off, transistor 505 is turned on. Vbias raises the voltage on the drain and source terminals of the selection transistor 550 to reduce parasitic capacitance and ensure the parasitic junctions remain reversed biased across the full range of the output signal on nodes N1 and N2. Alternatively, when the selection transistor 550 is activated, transistor 506 is turned on to ground these resistors. For example, the gate terminal 506A of transistor 506 may be coupled to the select signal so that transistor 506 is turned on when transistor 550 is turned on. Features and advantages of the present invention include using a low noise bias circuit 525 to generate Vbias and to reduce the amount of noise coupled into the capacitor blocks as described below.

Figure 6A:
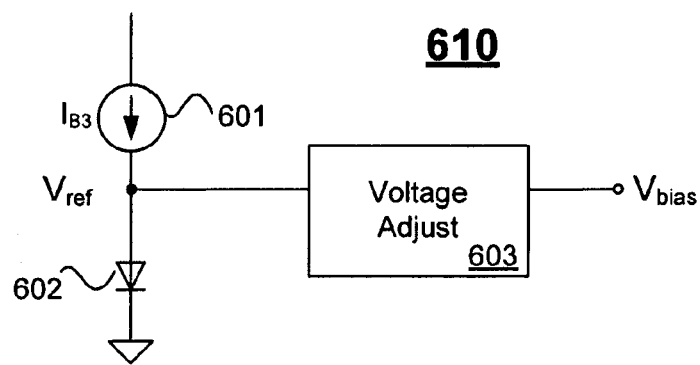
FIG. 6A illustrates example low noise bias circuits according to embodiments of the present invention.
Figure 6A:
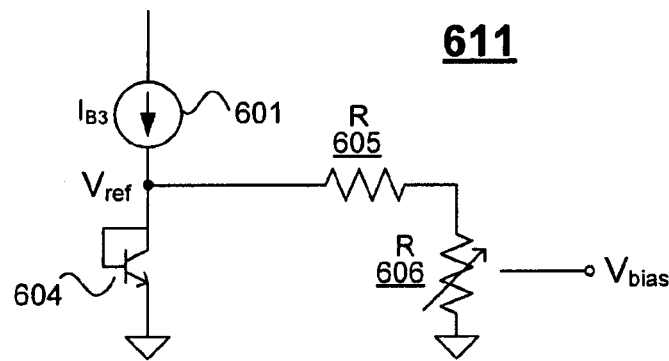
Figure 6A:
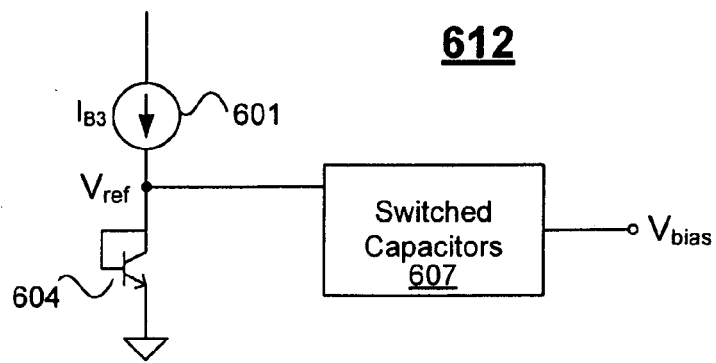

FIG. 6A illustrates example low noise bias circuits according to embodiments of the present invention. Circuit 610 illustrates one low noise bias circuit. In this example, a current source 601 is coupled to a PN junction diode. The current into the diode generates a reference voltage, Vref, which is equal to the turn on voltage of the diode. Vref may then be adjusted (e.g., increased using gain or decreased using attenuation) using voltage adjust circuit 603. The output bias voltage may be coupled to the capacitance blocks described above. Advantageously, a low input impedance PN junction is used to absorb any noise on current source 601. Accordingly, the bias voltage generated by bias circuit 601 has reduced noise compared with the current source used to generate the voltage. Circuit 611 illustrates another example low noise bias circuit. In this example, a bipolar transistor 604 is used to generate the reference voltage. For example, a parasitic bipolar transistor may be used for this purpose. The base of the bipolar transistor is coupled to the collector of the transistor and the emitter is coupled to ground. The circuit generates a reference voltage equal to the base-emitter voltage of the bipolar transistor. Similarly, the bipolar transistor has a low input impedance, so the transistor absorbs noise from the current source. In this example, the reference voltage is coupled through an attenuator, such as a resistor divider. Here, the resistor divider includes resistor 605 and a potentiometer or other variable resistor 606, for example, to generate a bias voltage that is less than the reference voltage. As illustrated in circuit 612, switched capacitors 607 may be used to either increase or decrease the reference voltage generated by the PN junction or transistor.

Figure 6B:
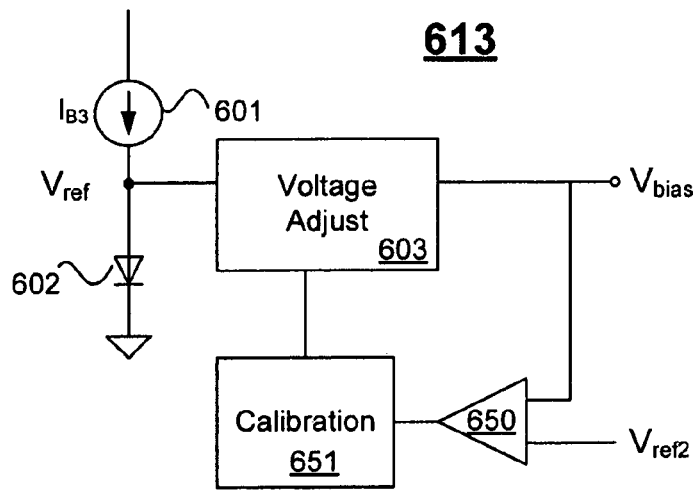
FIG. 6B illustrates an example of calibrating a low noise bias circuit according to one embodiment of the present invention.
Figure 6B:
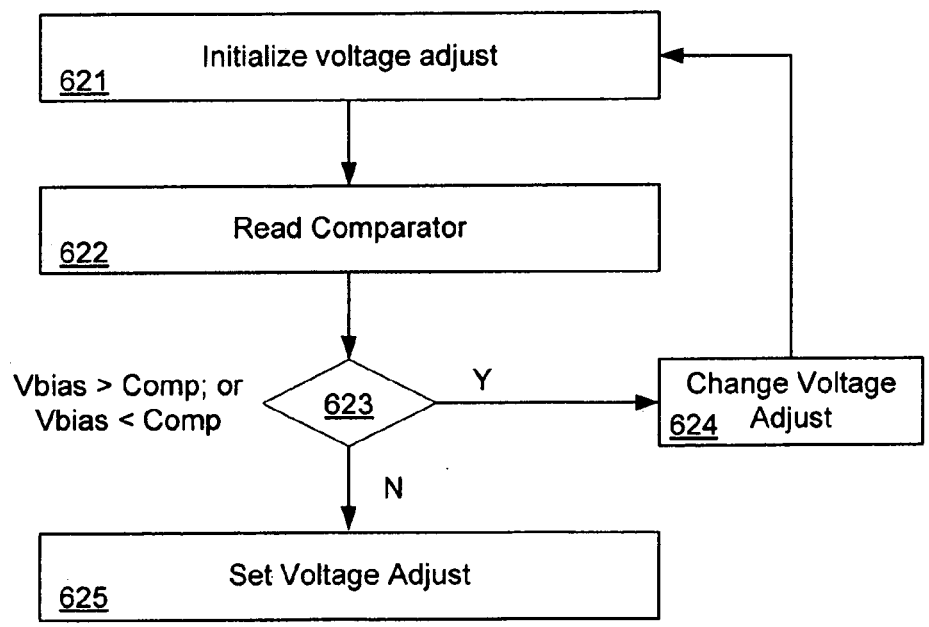

FIG. 6B illustrates an example of calibrating a low noise bias circuit according to one embodiment of the present invention. Circuit 613 includes a current source 601, PN junction 602, voltage adjust circuit 603, comparator 650, and calibration circuit 651. Calibration circuit 651 may be a digital calibration circuit, such as a state machine or internal or external controller, for example. Operation of circuit 613 may be understood with reference to flow chart 614. At 621, the voltage adjust circuit may be initialized. For example, if the voltage adjust circuit is an attenuator (e.g., a programmable divider), the attenuator may be set to 1 (zero attenuation). Similarly, if the voltage adjust circuit provides variable gain, then the gain may be set to 1. At 622, the bias voltage is compared against a reference voltage, Vref2. At 623 and 624 the comparator output may be used to change the setting of the voltage adjust circuit. In particular, the calibration circuit may set a gain or attenuation of the voltage adjust circuit. For example, if Vbias is greater than Vref2 and the voltage adjust is an attenuator, then calibration block 651 may increase the attenuation (e.g., increase the divider ratio) of the voltage adjust circuit. In other embodiments, switched capacitors could be initially configured at a low gain and incrementally increase the voltage if Vbias is less than Vref2, for example.

Figure 7:
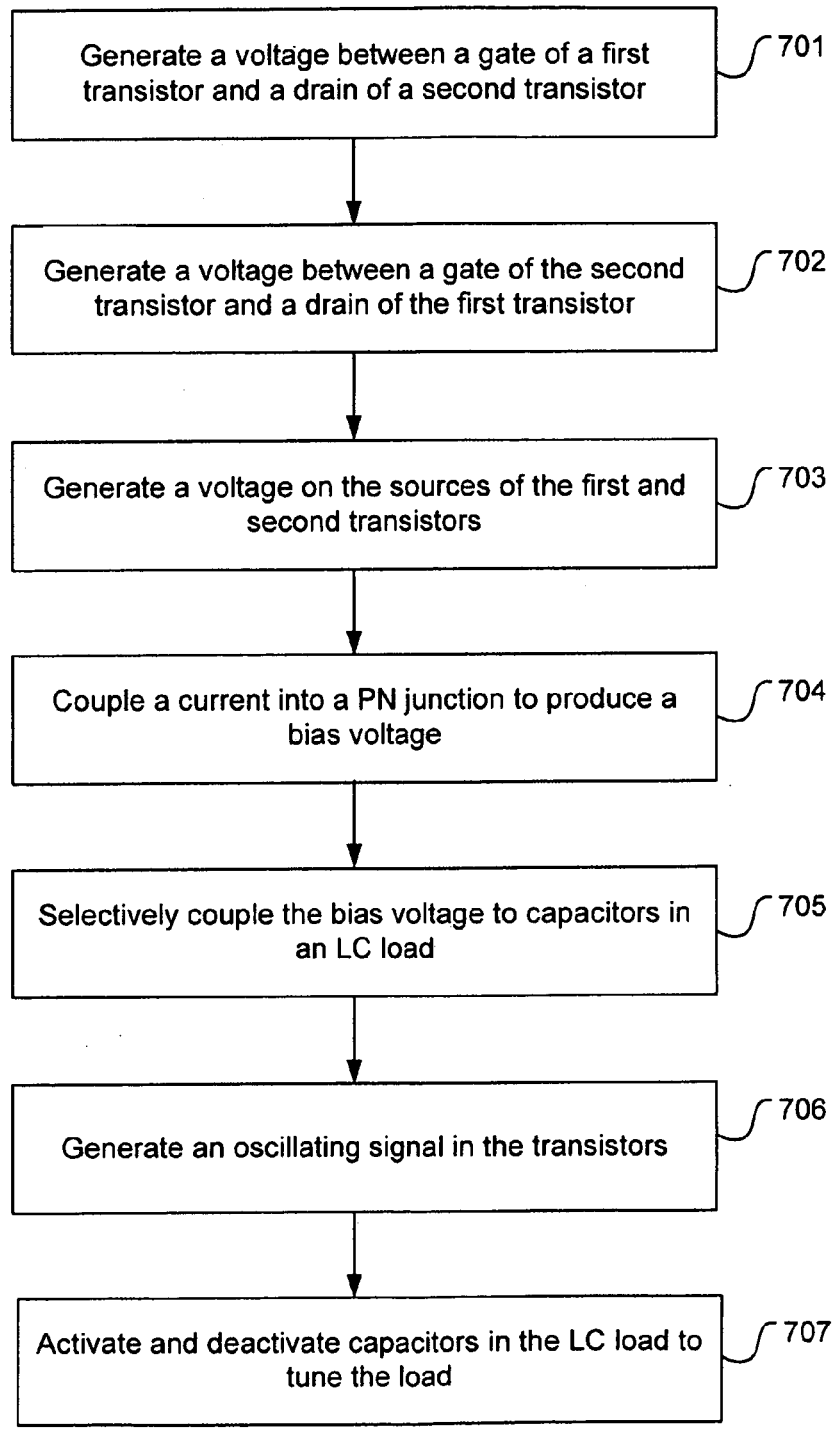
FIG. 7 illustrates a method for generating an oscillating signal according to one embodiment of the present invention.

FIG. 7 illustrates a method 700 for generating an oscillating signal according to another embodiment of the present invention. The above described techniques may be combined into a single system to generate oscillating signals, for example. At 701, a voltage may be generated between a gate of a first transistor and a drain of a second transistor. At 702, a voltage may be generated between a gate of the second transistor and a drain of the first transistor. At 703, a voltage may be generated on the sources of the first and second transistors. At 704, a current is coupled into a PN junction to produce a bias voltage. For example, a parasitic bipolar transistor may be configured as a diode to generate the bias voltage. At 705, the bias voltage is selectively coupled to capacitors in an LC load. For example, if a capacitance block is deactivated in the LC load, then the bias voltage may be coupled to capacitors in the capacitance block as described above. At 706, an oscillating signal is generated in the transistors. The transistors may act as a driver to create a resonant oscillating signal in the load. At 707, capacitors in the LC load may be activated or deactivated to tune the load. Changing the capacitors in the load will change the resonant frequency of the load and thereby adjust the frequency of the oscillating signal.

Figure 8:
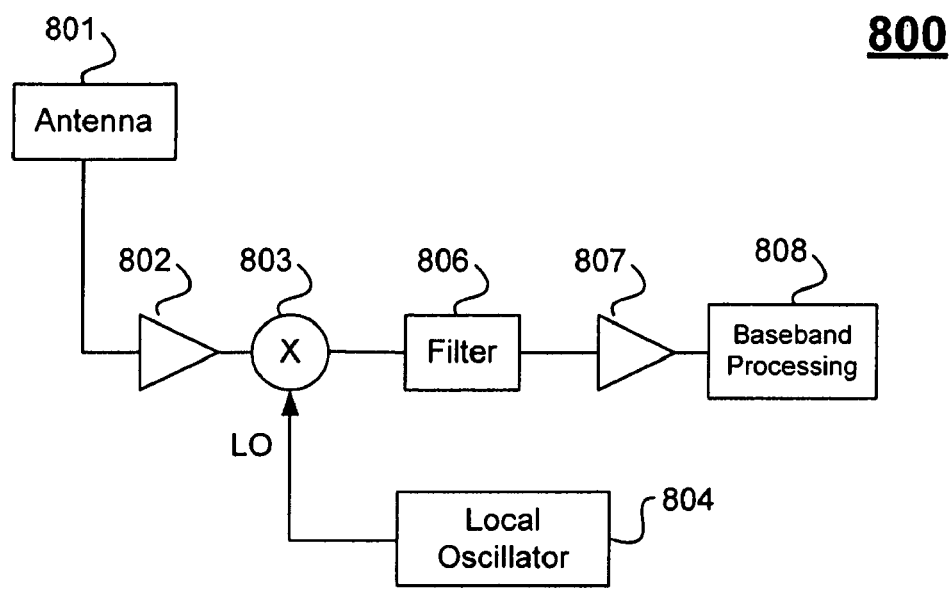
FIG. 8 illustrates a block diagram of a communication system utilizing circuits to reduce phase noise in an oscillator according to another embodiment of the present invention.

FIG. 8 illustrates a block diagram of a communication system 800 utilizing noise reduction circuits in an oscillator as described above. Communication system 800 includes antenna 810, amplifier 802, mixer 803, local oscillator 804, filter 806, amplifier 807, and baseband processing 808, for example. Local oscillator 804 may incorporate one or more of the techniques described above to generate a local oscillating signal (LO) for demodulating a modulated signal received by antenna 801. These techniques may also be for transmitter signal modulation before transmitting it through the antenna. Examples of communication systems that may use embodiments of the present invention include FM systems or wireless data communication systems, for example.

Antenna 801 receives an RF input signal and amplifier 802 provides gain to the input signal. The mixer 803 is coupled to receive the input signal and the local oscillator signal (LO) generated by local oscillator 804. Mixer 803 is also coupled to provide a demodulated signal to filter 804. The demodulated signal corresponds to the input signal with the carrier frequency removed. Different communication system may incorporate one or more mixers and local oscillator signals to convert a signal from RF down to baseband.

Filter 804 filters out any undesirable frequency components and amplifier 805 provides additional gain. The demodulated (or baseband) signal may then be processed according to a variety of system specific techniques to extract information out of the signal using baseband processor 808. Providing an LO signal utilizing an oscillator circuit incorporating the noise reduction techniques described above increases the quality of the demodulated analog signal provided to baseband processor 808. A similar improvement may be realized for modulating signals in communication systems that provide transmitted signals.

The above description illustrates various embodiments of the present invention along with examples of how aspects of the present invention may be implemented. The above examples and embodiments should not be deemed to be the only embodiments, and are presented to illustrate the advantages of the present invention as defined by the following claims. Based on the above disclosure and the following claims, other arrangements, embodiments, implementations and equivalents will be evident to those skilled in the art and may be employed without departing from the scope of the invention as defined by the claims.

What is claimed is:

1. A circuit comprising:
   a first transistor having a control terminal, a drain terminal, and a source terminal;
   a second transistor having a control terminal, a drain terminal, and a source terminal;
   a first bias network having i) as first terminal coupled to the control terminal of the first transistor and ii) a second terminal coupled to the drain terminal of the second transistor, the first bias network generating a first voltage difference across a first component between i) the control terminal of the first transistor and ii) the drain terminal of the second transistor to increase a first drain voltage at the drain terminal of the second transistor, wherein the first voltage difference is set using a second component coupled to the first component;
   a second bias network having i) first terminal coupled to the control terminal of the second transistor and ii) a second terminal coupled to the drain terminal of the first transistor, the second bias network generating a second voltage difference across a third component between i) the control terminal of the second transistor and ii) the drain terminal of the first transistor to increase a second drain voltage at the drain terminal of the first transistor, wherein the second voltage difference is set using a fourth component coupled to the third component; and
   a load circuit having i) first terminal coupled to the drain of the first transistor and ii) a second terminal coupled to the drain of the second transistor.

2. The circuit of claim 1, wherein the first component comprises a first resistor coupled between i) the control terminal of the first transistor and ii) the drain terminal of the second transistor, and wherein the third component comprises a second resistor coupled between i) the control terminal of the second transistor and ii) the drain terminal of the first transistor.

3. The circuit of claim 2, wherein the first bias network further comprises a first capacitor coupled between i) the control terminal of the first transistor and ii) the drain terminal of the second transistor, and wherein the second bias network comprises a second capacitor coupled between i) the control terminal of the second transistor and ii) the drain terminal of the first transistor.

4. The circuit of claim 2, wherein the second component further comprises a first current source coupled to the control terminal of the first transistor, and wherein the fourth component comprises a second current source coupled to the control terminal of the second transistor.

5. The circuit of claim 2, wherein the second component further comprises a third resistor coupled between i) the control terminal of the first transistor and ii) a reference voltage, and wherein the fourth component comprises a fourth resistor coupled between i) the control terminal of the second transistor and ii) the reference voltage.

6. The circuit of claim 1, further comprising a third bias network coupled to i) the source of the first transistor and ii) the source of the second transistor, the third bias network generating a third voltage difference between i) the sources of the first and second transistors and ii) a reference voltage.

7. The circuit of claim 6 wherein the third bias network comprises a resistor having i) a first terminal coupled to the sources of the first and second transistors and ii) a second terminal coupled to the reference voltage.

8. The circuit of claim 1, wherein the load circuit comprises inductance and capacitance, and wherein the circuit is an oscillator circuit.

9. The circuit of claim 1, wherein said first and second transistors are NMOS or PMOS transistors.

10. A circuit comprising:
    a driver circuit, the driver circuit generating a differential periodic signal on first and second nodes;
    an inductance network coupled between the first and second nodes; and
    a capacitance network coupled between the first and second nodes, the capacitance network comprising:
    a first capacitor having i) a first terminal coupled to the first node and ii) a second terminal; and
    a second capacitor having i) a first terminal coupled to the second node and ii) a second terminal; and
    a bias voltage generator comprising a current source coupled to a PN junction to generate a reference voltage, wherein:
    the reference voltage includes a PN junction voltage across the PN junction; and
    the reference voltage is selectively coupled to i) the second terminal of the first capacitor and ii) the second terminal of the second capacitor.

11. The circuit of claim 10, further comprising a voltage adjust circuit coupled between i) the reference voltage and ii) the second terminal of the first capacitor and the second terminal of the second capacitor, wherein the voltage adjust circuit changes the reference voltage selectively coupled to the second terminal of the first capacitor and the second terminal of the second capacitor.

12. The circuit of claim 11, wherein the voltage adjust circuit comprises a resistor divider.

13. The circuit of claim 10, wherein the PN junction comprises a bipolar transistor having i) an emitter and ii) a base coupled to a collector.

14. A circuit comprising:
    a driver circuit, the driver circuit generating a differential periodic signal on first and second nodes;
    an inductance network coupled between the first and second nodes; and
    a capacitance network coupled between the first and second nodes, the capacitance network comprising:
    a first capacitor having i) a first terminal coupled to the first node and ii) a second terminal; and
    a second capacitor having i) a first terminal coupled to the second node and ii) a second terminal;
    a bias voltage generator comprising a current source coupled to a PN junction to generate a reference voltage, wherein the reference voltage is selectively coupled to i) the second terminal of the first capacitor and ii) the second terminal of the second capacitor; and
    a voltage adjust circuit coupled between i) the reference voltage and ii) the second terminal of the first capacitor and the second terminal of the second capacitor, wherein the voltage adjust circuit changes the voltage selectively coupled to i) the second terminal of the first capacitor and ii) the second terminal of the second capacitor, wherein the voltage adjust circuit comprises a switched capacitor circuit.

15. The circuit of claim 14, wherein the switched capacitor circuit increases the reference voltage.

16. A circuit comprising:
    a driver circuit, the driver circuit generating a differential periodic signal on first and second nodes;
    an inductance network coupled between the first and second nodes; and
    a capacitance network coupled between the first and second nodes, the capacitance network comprising:

a first capacitor having i) a first terminal coupled to the first node and ii) a second terminal;

a second capacitor having i) a first terminal coupled to the second node and ii) a second terminal;

a bias voltage generator comprising a current source coupled to a PN junction to generate a reference voltage, wherein the reference voltage is selectively coupled to i) the second terminal of the first capacitor and ii) the second terminal of the second capacitor;

a voltage adjust circuit coupled between i) the reference voltage and ii) the second terminal of the first capacitor and the second terminal of the second capacitor, wherein the voltage adjust circuit changes the voltage selectively coupled to i) the second terminal of the first capacitor and ii) the second terminal of the second capacitor;

a comparator having i) a first input coupled to an output of the voltage adjust circuit and ii) a second input coupled to a second reference voltage; and a calibration circuit having i) a first input coupled to an output of the comparator and ii) an output coupled to the voltage adjust circuit, wherein the calibration circuit sets a gain or attenuation of the voltage adjust circuit.

17. A circuit comprising:

a first transistor having a control terminal, a drain terminal, and a source terminal;

a second transistor having a control terminal, a drain terminal, and a source terminal;

a first bias network having i) a first terminal coupled to the control terminal of the first transistor and ii) a second terminal coupled to the drain terminal of the second transistor, the first bias network generating a first voltage difference between i) the control terminal of the first transistor and ii) the drain terminal of the second transistor;

a second bias network having i) a first terminal coupled to the control terminal of the second transistor and ii) a second terminal coupled to the drain terminal of the first transistor, the second bias network generating a second voltage difference between i) the control terminal of the second transistor and ii) the drain terminal of the first transistor;

an inductance network coupled between i) the drain of the first transistor and ii) the drain of the second transistor; and a capacitance network coupled between i) the drain of the first transistor and ii) the drain of the second transistor, the capacitance network comprising:

a first capacitor having i) a first terminal coupled to the drain of the first transistor and ii) a second terminal; and a second capacitor having i) a first terminal coupled to the drain of the second transistor and ii) a second terminal; and a bias voltage generator comprising a current source coupled to a PN junction to generate a reference voltage, wherein:

the reference voltage includes a PN junction voltage across the PN junction; and the reference voltage is selectively coupled to i) the second terminal of the first capacitor and ii) the second terminal of the second capacitor.

18. The circuit of claim 17, wherein:

the first bias network comprises i) a first resistor coupled between ia) the control terminal of the first transistor and ib) the drain terminal of the second transistor and ii) a first current source coupled to the control terminal of the first transistor, and the second bias network comprises:

a second resistor coupled between i) the control terminal of the second transistor and ii) the drain terminal of the first transistor, and a second current source coupled to the control terminal of the second transistor.

19. The circuit of claim 17, wherein:

the first bias network comprises i) a first resistor coupled between ia) the control terminal of the first transistor and ib) the drain terminal of the second transistor and ii) a third resistor between the control terminal of the first transistor and a second reference voltage, and the second bias network comprises:

a second resistor coupled between i) the control terminal of the second transistor and ii) the drain terminal of the first transistor, and a fourth resistor coupled between i) the control terminal of the second transistor and ii) the second reference voltage.

20. The circuit of claim 17, further comprising a resistor having i) a first terminal coupled to the sources of the first and second transistors and ii) a second terminal coupled to a second reference voltage.

21. The circuit of claim 17, wherein:

the first bias network generates a first voltage difference across a first component between ii) the control terminal of the first transistor and ii) the drain terminal of the second transistor to increase a first drain voltage at the drain terminal of the second transistor, wherein the first voltage difference is set using a second component coupled to the first component, and the second bias network generates a second voltage difference across a third component between i) the control terminal of the second transistor and ii) the drain terminal of the first transistor to increase a second drain voltage at the drain terminal of the first transistor, wherein the second voltage difference is set using a fourth component coupled to the third component.

* * * * *